(12) United States Patent
Tahara et al.

(10) Patent No.: US 10,924,072 B2
(45) Date of Patent: Feb. 16, 2021

(54) POWER AMPLIFICATION CIRCUIT

(71) Applicant: Murata Manufacturing Co., Ltd., Kyoto (JP)

(72) Inventors: Kenji Tahara, Kyoto (JP); Kenichi Shimamoto, Kyoto (JP); Shigeru Tsuchida, Kyoto (JP); Mitsunori Samata, Kyoto (JP); Yoshiaki Sukemori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 24 days.

(21) Appl. No.: 16/296,754

(22) Filed: Mar. 8, 2019

(65) Prior Publication Data

US 2019/0305736 A1  Oct. 3, 2019

(30) Foreign Application Priority Data

Mar. 28, 2018 (JP) .................................. 2018-063080
Jul. 30, 2018 (JP) .................................. 2018-142909

(51) Int. Cl.
*H03F 3/04* (2006.01)
*H03F 3/24* (2006.01)
*H03F 3/195* (2006.01)

(52) U.S. Cl.
CPC ............. *H03F 3/245* (2013.01); *H03F 3/195* (2013.01); *H03F 2200/102* (2013.01)

(58) Field of Classification Search
CPC .... H03F 3/245; H03F 3/195; H03F 2200/102; H03F 2200/411; H03F 3/20; H03F 1/0211
USPC ................................ 330/296, 285, 310, 133
See application file for complete search history.

(56) References Cited

U.S. PATENT DOCUMENTS

2007/0252646 A1  11/2007  Leung et al.
2014/0049322 A1   2/2014  Jeon et al.
2018/0159476 A1   6/2018  Balteanu et al.

FOREIGN PATENT DOCUMENTS

JP       2016-32301 A    3/2016
KR   10-2006-0129383 A   12/2006
KR   10-2014-0024204 A    2/2014

*Primary Examiner* — Khanh V Nguyen
*Assistant Examiner* — Khiem D Nguyen
(74) *Attorney, Agent, or Firm* — Pearne & Gordon LLP

(57) ABSTRACT

A power amplification circuit includes an amplification transistor, a variable voltage power supply that supplies a variable voltage to a collector of the amplification transistor, a bias circuit that has a constant current amplification transistor outputting a DC bias current to a base of the amplifier transistor, and a current limiting circuit that limits the DC bias current. The current limiting circuit includes a current limiting transistor, a resistor element connected to a collector of the current limiting transistor and the variable voltage power supply, and a resistor element connected to a base of the current limiting transistor and a base of the constant current amplifying transistor.

15 Claims, 15 Drawing Sheets

FIG. 6A
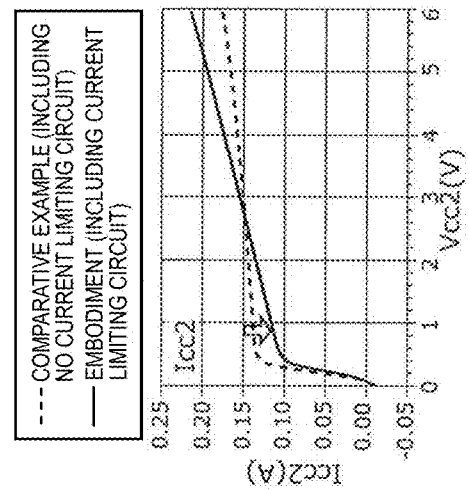
FIG. 6B
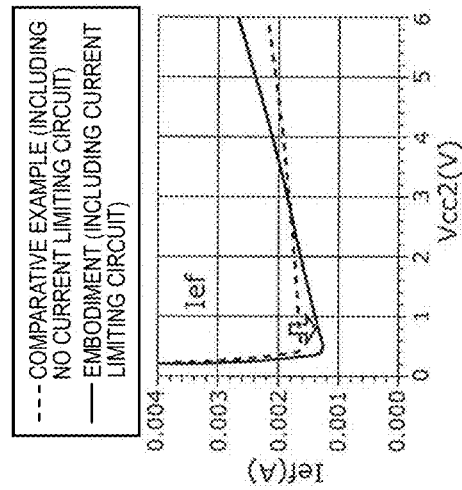
FIG. 6C
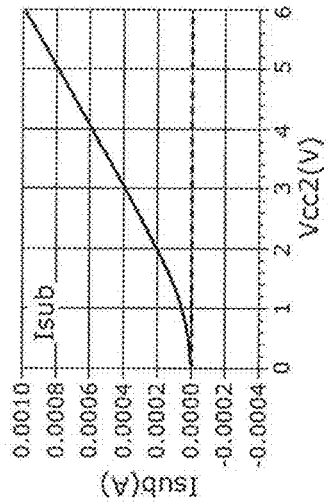
FIG. 6D
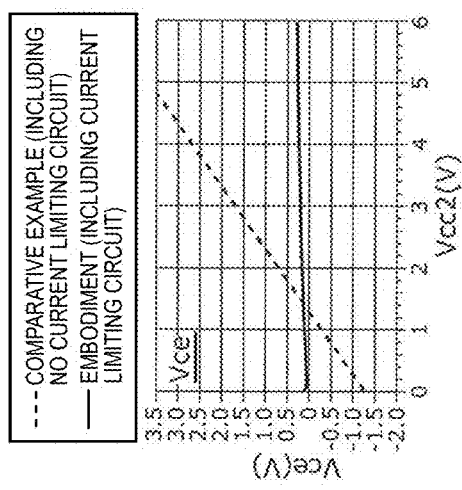
FIG. 6E
FIG. 6F
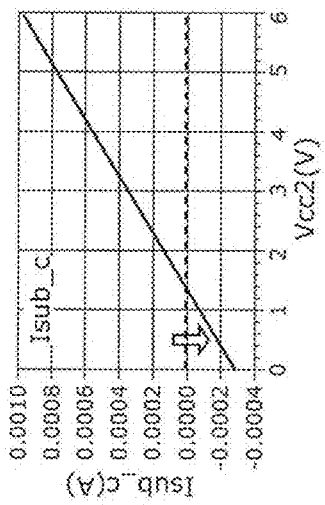

APT MODE

ET MODE

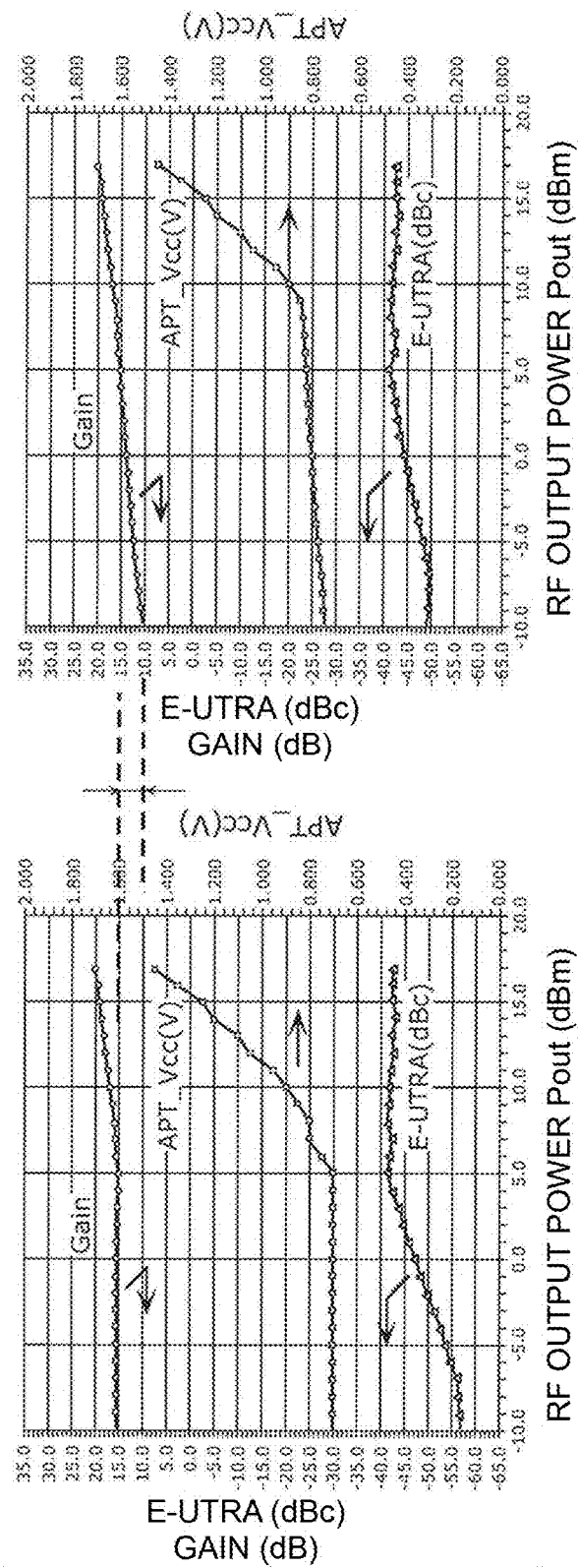
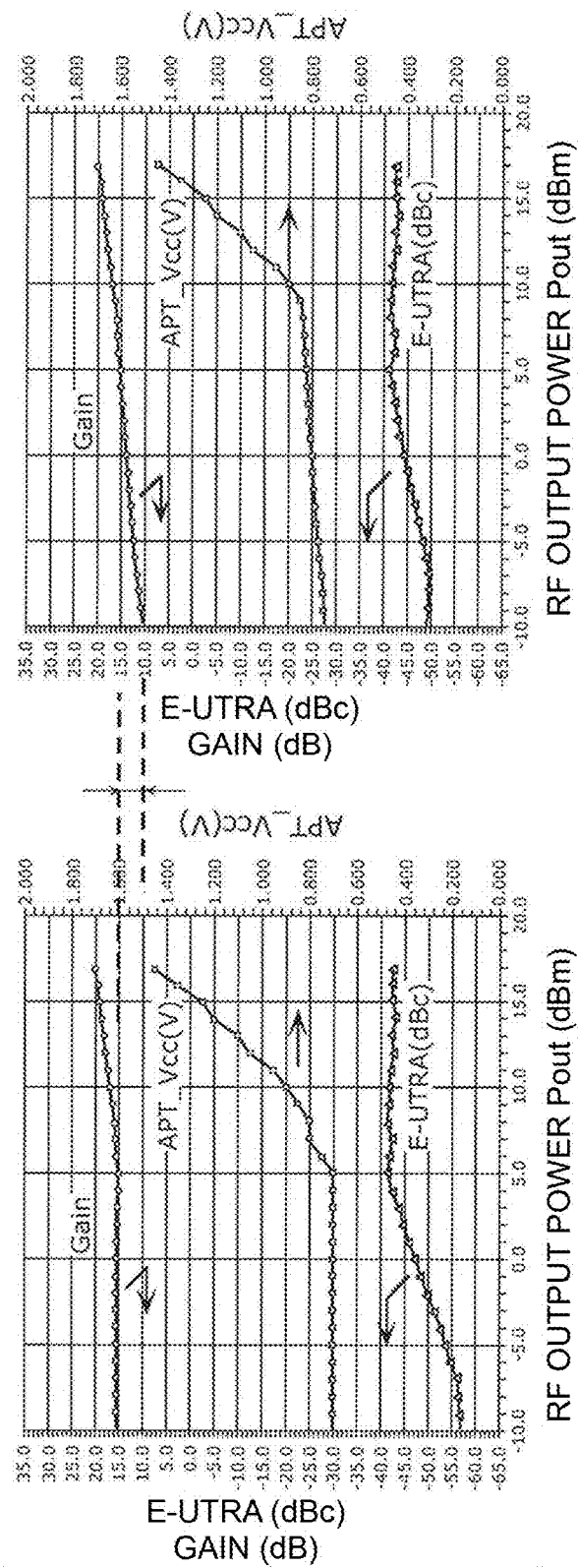
FIG. 12A COMPARATIVE EXAMPLE
FIG. 12B SECOND EMBODIMENT

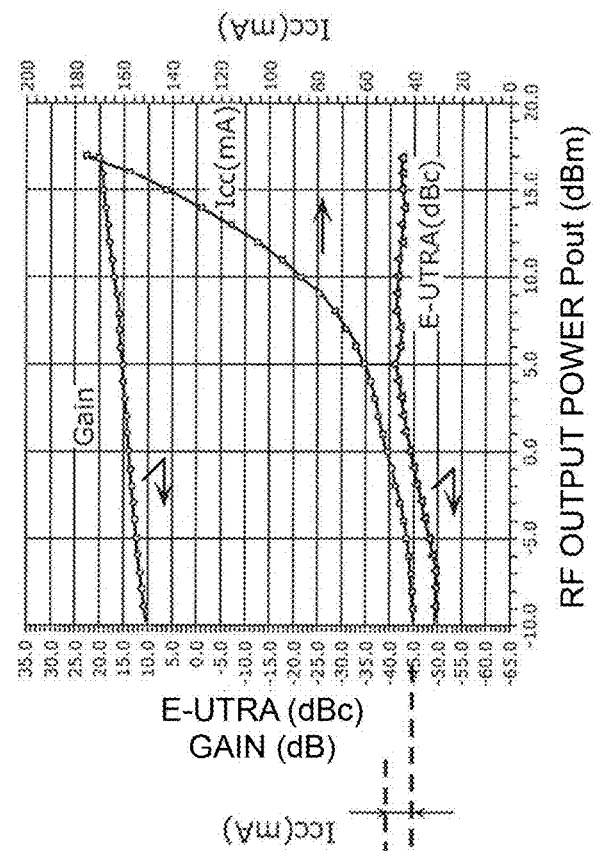
FIG. 13B  SECOND EMBODIMENT
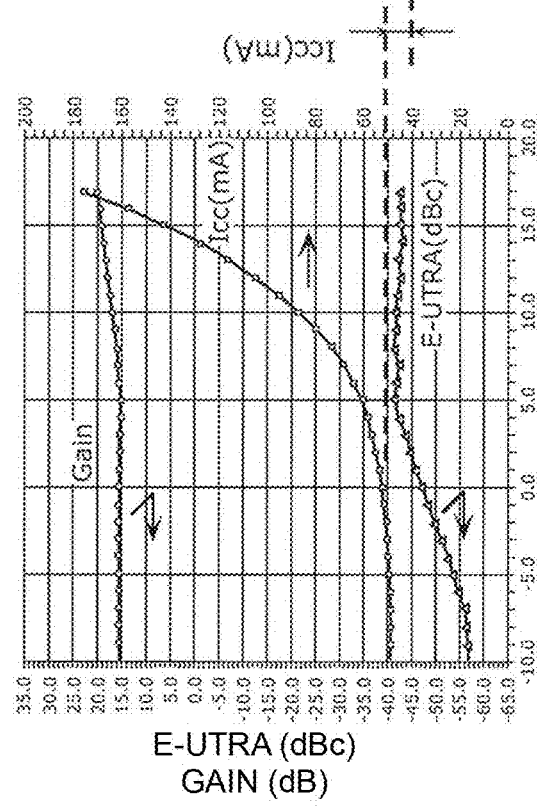
FIG. 13A  COMPARATIVE EXAMPLE

POWER AMPLIFICATION CIRCUIT

This application claims priority from Japanese Patent Application No. 2018-063080 filed on Mar. 28, 2018, and claims priority from Japanese Patent Application No. 2018-142909 filed on Jul. 30, 2018. The content of these applications are incorporated herein by reference in their entireties.

BACKGROUND OF THE DISCLOSURE

1. Field of the Disclosure

The present disclosure relates to a power amplification circuit.

2. Description of the Related Art

In accordance with miniaturization and weight reduction of mobile communication equipment, miniaturization and long life of a battery that is mounted on the mobile communication equipment and miniaturization and reduction in power consumption of a power amplifier have been required. As a measure to reduce the power consumption of the power amplifier, a method has been proposed in which the power amplitude (envelope) of a high-frequency signal is tracked (envelope tracking method) and a voltage supply level to the power amplifier is varied in accordance with the envelope (for example, Japanese Unexamined Patent Application Publication No. 2016-32301). Specifically, the voltage supply level to the power amplifier is increased in accordance with the increase in the envelope of the high-frequency signal whereas the voltage supply level to the power amplifier is decreased in accordance with decrease in the envelope. Thus, power consumption (current consumption) of the power amplifier can be reduced.

However, for example, in a conventional power amplifier using an emitter-grounded bipolar transistor, even if a power supply voltage (collector voltage) is varied in accordance with the power amplitude of a high-frequency signal, a DC bias current which is supplied to a base terminal of the transistor is substantially constant.

Since a collector-emitter current (driving current) that strongly affects power-added efficiency is correlated with a base-emitter current (DC bias current), the collector-emitter current is substantially constant when the base-emitter current is substantially constant. Therefore, even if the power supply voltage (collector voltage) is varied in accordance with the above-described power amplitude, the power-added efficiency is not significantly improved, and thus, effective reduction in the power consumption cannot be realized.

BRIEF SUMMARY OF THE DISCLOSURE

Accordingly, it is an object of the present disclosure to provide a power amplification circuit with improved power-added efficiency.

According to preferred embodiments of the present disclosure, a power amplification circuit, which performs power amplification on a high-frequency signal, includes a first amplification transistor that has a first terminal, a second terminal, and a first control terminal, performs power amplification on the high-frequency signal inputted from the first control terminal, and outputs, from the first terminal, the high-frequency signal on which the power amplification has been performed, a variable voltage power supply that supplies a variable voltage to the first terminal, a bias circuit that outputs a DC (direct current) bias current, and a current limiting circuit that limits the DC bias current, wherein the bias circuit includes a constant current amplification transistor that has a third terminal, a fourth terminal, and a second control terminal and outputs the DC bias current from the fourth terminal toward the first control terminal, the current limiting circuit includes a current limiting transistor that has a fifth terminal, a sixth terminal, and a third control terminal, the sixth terminal being connected to the fourth terminal, a first resistor element one end of which is connected to the fifth terminal and the other end of which is connected to the variable voltage power supply, and a second resistor element one end of which is connected to the third control terminal and the other end of which is connected to the second control terminal.

Other features, elements, characteristics and advantages of the present disclosure will become more apparent from the following detailed description of preferred embodiments of the present disclosure with reference to the attached drawings.

BRIEF DESCRIPTION OF THE SEVERAL VIEWS OF THE DRAWINGS

FIGS. 6A to 6F are graphs for explaining operations of a current limiting circuit according to the first embodiment;

FIG. 12A is a graph illustrating relationships between high-frequency output power and gain, an APT variable voltage, and the like in a power amplification circuit according to a comparative example;

FIG. 12B is a graph illustrating relationships between high-frequency output power and gain, an APT variable voltage, and the like in the power amplification circuit according to the second embodiment;

FIG. 13A is a graph illustrating relationships between the high-frequency output power and the gain, a collector current, and the like in the power amplification circuit according to the comparative example;

FIG. 13B is a graph illustrating relationships between the high-frequency output power and the gain, a collector current, and the like in the power amplification circuit according to the second embodiment.

DETAILED DESCRIPTION OF THE DISCLOSURE

Figure 1:
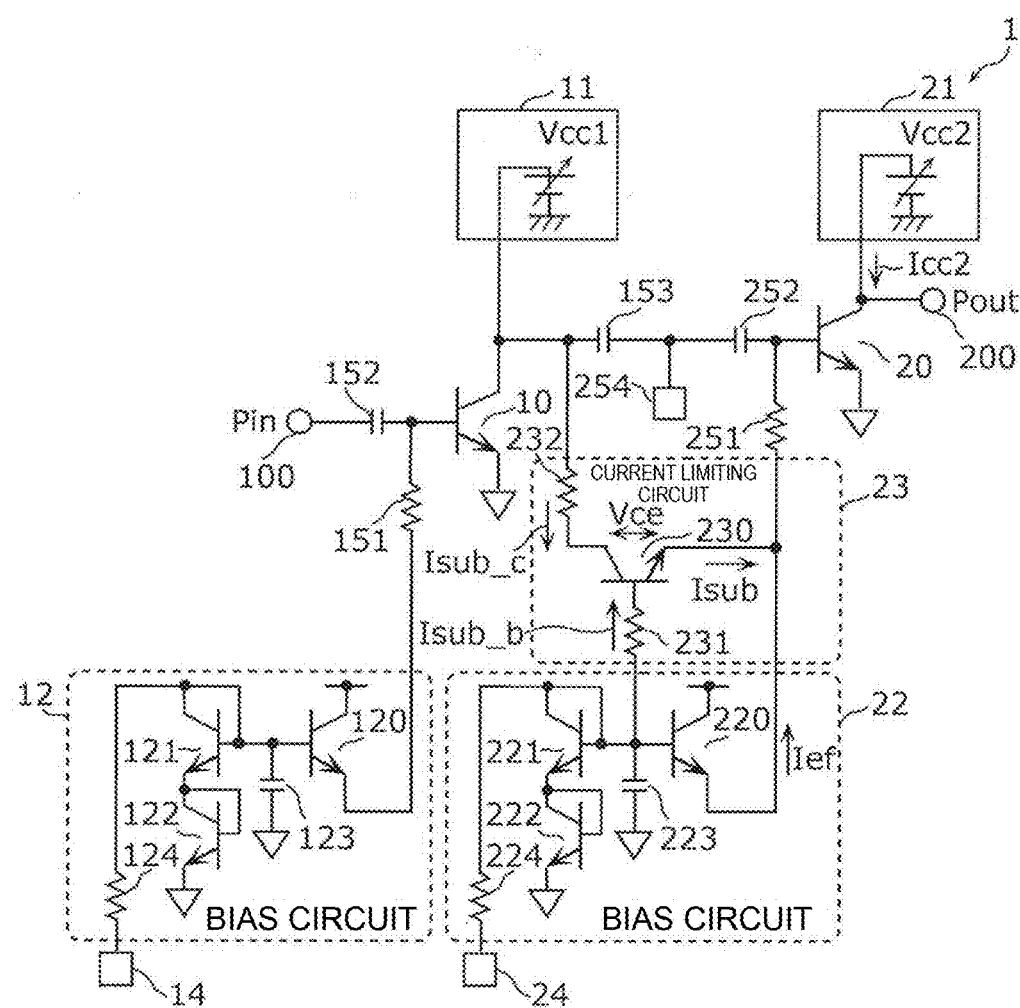
FIG. 1 is a configuration diagram of a power amplification circuit and a peripheral circuit thereof according to a first embodiment.

Hereinafter, modes for carrying out the present disclosure will be described in detail with reference to embodiments and the drawings. It should be noted that each of the embodiments, which will be described below, represents a comprehensive or specific example. Numerical values, shapes, materials, components, arrangement and connection forms of the components, and the like, which are described in the following embodiments, are merely examples and are not intended to limit the disclosure. Components that are not described in independent claims among the components in the following embodiments will be described as optional components. Also, sizes or ratios of the sizes of the components illustrated in the drawings are not necessarily critical.

First Embodiment

1. Configuration of Power Amplification Circuit

FIG. 1 is a configuration diagram of a power amplification circuit 1 and a peripheral circuit thereof according to a first embodiment. FIG. 1 illustrates the power amplification circuit 1 according to the embodiment and constant current sources 14 and 24. As illustrated in FIG. 1, the power amplification circuit 1 includes a high-frequency input terminal 100, a high-frequency output terminal 200, amplification transistors 10 and 20, variable voltage power supplies 11 and 21, bias circuits 12 and 22, a current limiting circuit 23, resistor elements 151 and 251, capacitors 152, 153 and 252, and an impedance matching circuit 254.

With the above configuration, the power amplification circuit 1 amplifies a high-frequency signal inputted from the high-frequency input terminal 100 by the amplification transistors 10 and 20 and outputs the amplified high-frequency signal from the high-frequency output terminal 200.

The amplification transistor 10 is an anterior-stage amplification transistor that has a base terminal, a collector terminal, and an emitter terminal, performs power amplification on the high-frequency signal inputted from the base terminal, and outputs, from the collector terminal thereof, the high-frequency signal on which the power amplification has been performed.

The amplification transistor 20 is a posterior-stage first amplification transistor that has a base terminal (first control terminal), a collector terminal (first terminal), and an emitter terminal (second terminal), performs power amplification on the high-frequency signal inputted from the base terminal (first control terminal), and outputs, from the collector terminal (first terminal) thereof, the high-frequency signal on which the power amplification has been performed.

The amplification transistors 10 and 20 are, for example, bipolar transistors having base terminals, emitter terminals, and collector terminals. Note that the amplification transistors 10 and 20 are not limited to the bipolar transistors and may be, for example, MOSFET (MOS field-effect transistor (Metal-Oxide-Semiconductor Field-Effect Transistor)).

The variable voltage power supply 11 supplies a variable voltage Vcc1 to the collector terminal of the amplification transistor 10. The variable voltage power supply 21 supplies a variable voltage Vcc2 to the collector terminal of the amplification transistor 20. Note that the variable voltages Vcc1 and Vcc2 synchronously vary. In other words, when the variable voltage Vcc1 is increased, the variable voltage Vcc2 is also increased, and when the variable voltage Vcc1 is decreased, the variable voltage Vcc2 is also decreased.

The bias circuit 12 outputs a DC bias current toward the base terminal of the amplification transistor 10. More specifically, the bias circuit 12 includes a constant current amplification transistor 120, diode-connected transistors 121 and 122, a capacitor 123, and a resistor element 124.

The constant current amplification transistor 120 has a collector terminal, an emitter terminal, and a base terminal, and outputs the DC bias current from the emitter terminal thereof toward the base terminal of the amplification transistor 10. With this configuration, a constant current outputted from the constant current source 14 is inputted to the base terminal of the constant current amplification transistor 120 and is amplified to be the DC bias current. Then, the DC bias current is supplied to the base terminal of the amplification transistor 10 from the emitter terminal of the constant current amplification transistor 120 while flowing through the resistor element 151.

The bias circuit 22 outputs an effective DC bias current Ief toward the base terminal of the amplification transistor 20. More specifically, the bias circuit 22 includes a constant current amplification transistor 220, diode-connected transistors 221 and 222, a capacitor 223, and a resistor element 224.

The constant current amplification transistor 220 has a collector terminal (third terminal), an emitter terminal (fourth terminal), and a base terminal (second control terminal) and outputs the DC bias current Ief from the emitter terminal (fourth terminal) thereof toward the base terminal (first control terminal) of the amplification transistor 20. With this configuration, a constant current outputted from the constant current source 24 is inputted to the base terminal of the constant current amplification transistor 220 and is amplified to be the DC bias current Ief. Then, the DC bias current Ief is supplied to the base terminal of the amplification transistor 20 from the emitter terminal (fourth terminal) of the constant current amplification transistor 220 while flowing through the resistor element 251.

The current limiting circuit 23 limits the DC bias current which is outputted from the bias circuit 22. More specifically, the current limiting circuit 23 includes a current limiting transistor 230 and resistor elements 231 and 232.

The current limiting transistor 230 has a collector terminal (fifth terminal), an emitter terminal (sixth terminal), and a base terminal (third control terminal), and the emitter terminal (sixth terminal) thereof is connected to the emitter terminal (fourth terminal) of the constant current amplification transistor 220.

The resistor element 232 is a first resistor element one end of which is connected to the collector terminal (fifth terminal) of the current limiting transistor 230 and the other end of which is connected to the variable voltage power supply 11. Note that the other end of the resistor element 232 may be connected to the variable voltage power supply 21.

The resistor element 231 is a second resistor element one end of which is connected to the base terminal (third control terminal) of the current limiting transistor 230 and the other end of which is connected to the base terminal (second control terminal) of the constant current amplification transistor 220.

With the above connection configuration, when the variable voltage Vcc1 (Vcc2) becomes lower than a reference voltage, as a potential difference between the variable voltage Vcc1 (Vcc2) and the reference voltage is larger, the current limiting circuit 23 increases a DC limiting current as a DC current flowing to the collector terminal (fifth terminal) of the current limiting transistor 230 from the base terminal (second control terminal) of the constant current amplification transistor 220 while flowing through the base terminal (third control terminal) of the current limiting transistor 230. The reference voltage is, for example, a maximum variable voltage that is set when the high-frequency input signal inputted to the power amplification circuit 1 has a maximum power amplitude.

The capacitors 152, 153 and 252 are DC cutting capacitive elements that remove DC components of the high-frequency signal.

The impedance matching circuit 254 makes an output impedance of the amplification transistor 10 and an input impedance of the amplification transistor 20 match with each other.

In the power amplification circuit according to the disclosure, the resistor elements 151 and 251, the capacitors 152, 153, and 252, and the impedance matching circuit 254 are appropriately omitted or replaced by other circuit elements depending on required specifications of the power amplification circuit, and the like, and are not essential components.

The power amplification circuit 1 according to this embodiment includes the amplification transistor 20, the variable voltage power supply 11 that supplies the variable voltage Vcc2 (and Vcc1) to the collector terminal of the amplification transistor 20, the bias circuit 22 that has the constant current amplification transistor 220 outputting the DC bias current to the base terminal of the amplification transistor 20, and the current limiting circuit 23 that limits the DC bias current. The current limiting circuit 23 has the current limiting transistor 230, the resistor element 232 connected to the collector terminal of the current limiting transistor 230 and the variable voltage power supply 11, and the resistor element 231 connected to the base terminal of the current limiting transistor 230 and the base terminal of the constant current amplification transistor 220.

With this configuration, as the potential difference between the reference voltage and the variable voltage Vcc2 (and Vcc1) is larger, the DC limiting current flowing to the collector terminal of the current limiting transistor 230 from the base terminal of the constant current amplification transistor 220 can be increased.

In other words, since the base current (base-emitter current) of the amplification transistor 20 is limited with decrease in the variable voltage Vcc2 (and Vcc1), the collector current (collector-emitter current) of the amplification transistor 20 can be decreased. That is to say, since an optimum DC bias current Ief in accordance with the magnitude of the variable voltage Vcc2 (and Vcc1) can be made to flow, PAE (Power-Added Efficiency) of the power amplification circuit 1 can be improved. Note that circuit operations of the current limiting circuit 23 will be described later with reference to FIGS. 6A to 6F.

In addition, the current limiting circuit 23 configured by the one transistor (current limiting transistor 230) and the two resistor elements 231 and 232 controls the DC bias current Ief for optimizing an operating point of the amplification transistor 20 with the decrease in the variable voltage Vcc2 (and Vcc1) for driving the amplification transistor 20. As a result, the current limiting circuit 23 can be realized by a simplified circuit configuration, which can contribute to the miniaturization of the power amplification circuit 1.

Note that although the two-stage power amplification circuit 1 in which the amplification transistors 10 and 20 are cascade-connected is described in the embodiment, the number of stages of the amplification transistors may be equal to or greater than three. Thus, the gain of the power amplification circuit can be adjusted with the number of stages of the amplification transistors, and the gain can be increased as the number of stages is increased.

In the case of a power amplification circuit having the configuration in which a plurality of amplification transistors are cascade-connected, it is desirable that the amplification transistor to which the current limiting circuit 23 is connected is arranged at the last stage closest to an output terminal of the power amplification circuit among the plurality of amplification transistors as in the case of the power amplification circuit 1 according to the embodiment.

In other words, the power amplification circuit 1 according to the embodiment includes the plurality of amplification transistors connected in cascade, which includes the amplification transistor 20 as the first amplification transistor. Further, among the plurality of amplification transistors described above, the amplification transistor 20 arranged at the last stage closest to the output terminal of the power amplification circuit 1 is the above-described first amplification transistor. At the last stage, the variable voltage power supply 21, the bias circuit 22, and the current limiting circuit 23 are arranged.

Thus, the optimum direct-current bias current Ief in accordance with the magnitude of the variable voltage can be made to flow at the last stage at which the power level of the high-frequency signal becomes the highest, so that it is possible to effectively improve the power-added efficiency of the power amplification circuit.

2. Configuration of Power Amplification Circuit According to First Variation

Figure 2:
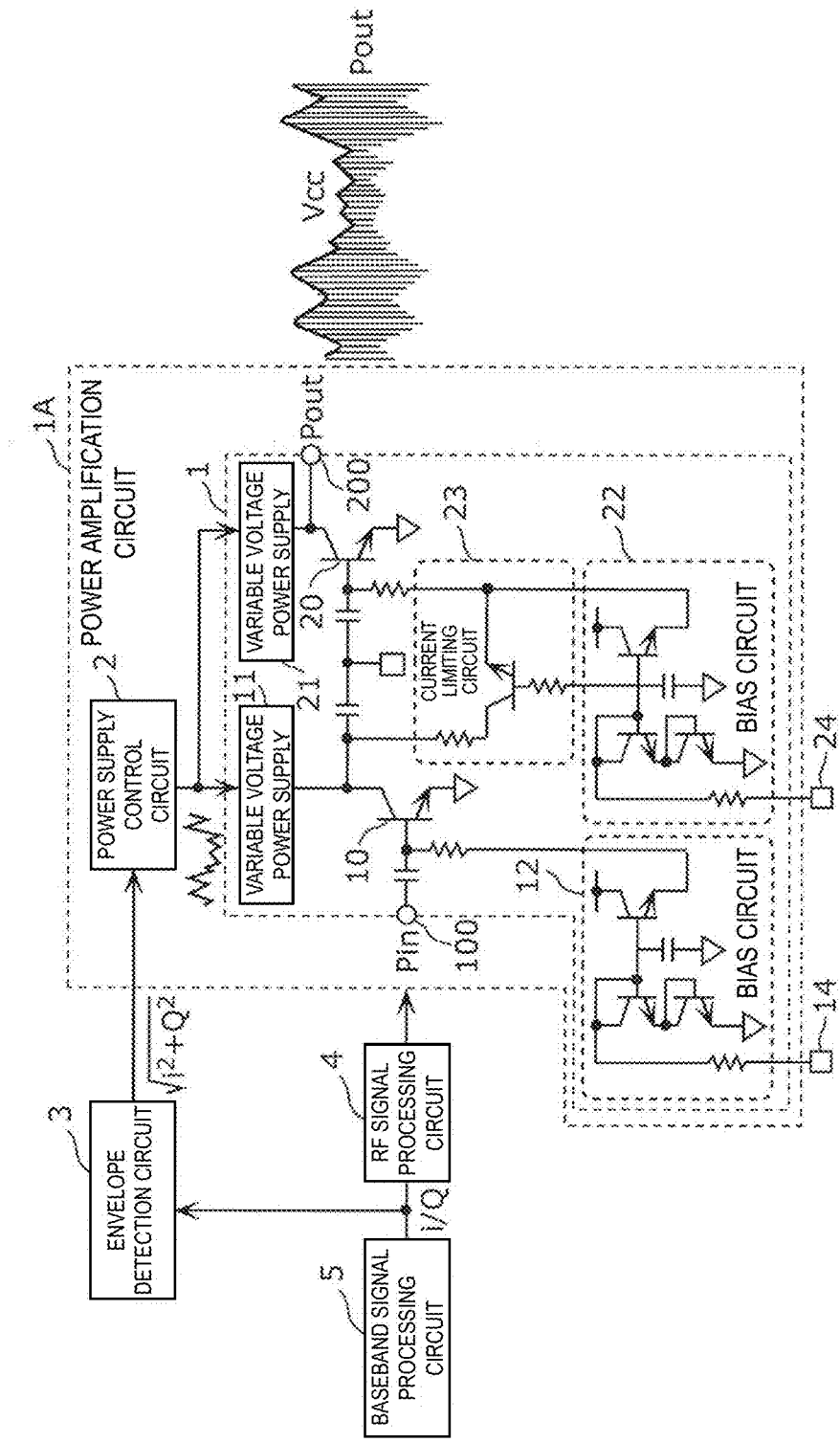
FIG. 2 is a configuration diagram of a power amplification circuit and a peripheral circuit thereof according to a first variation of the first embodiment.

FIG. 2 is a configuration diagram of a power amplification circuit 1A and a peripheral circuit thereof according to a first variation of the first embodiment. FIG. 2 illustrates the power amplification circuit 1A according to the variation, the constant current sources 14 and 24, an envelope detection circuit 3, an RFIC (RF signal processing circuit) 4, and a BBIC (baseband signal processing circuit) 5.

The power amplification circuit 1A is different from the power amplification circuit 1 according to the first embodiment only in that a power supply control circuit 2 is additionally provided. Hereinafter, for the power amplification circuit 1A according to the variation, the description of the same points as those of the power amplification circuit 1 according to the first embodiment will be omitted and description will be mainly made on different points.

The power supply control circuit 2 controls the variable voltages Vcc1 and Vcc2 in accordance with a power amplitude ($\sqrt{(i^2+Q^2)}$) of a high-frequency input signal (or a high-frequency output signal) outputted from the envelope detection circuit 3. The power supply control circuit 2 is, for example, a DC-DC converter. When the power supply control circuit 2 is configured by the DC-DC converter, the variable voltage power supplies 11 and 21 may be included in the DC-DC converter.

Note that the above-described symbols i and Q are parameters expressed by i(t)=A(t)cos φ(t) and Q(t)=A(t)sin φ(t), where the high-frequency signal (voltage) is A cos (2πfct+φ) (A: voltage amplitude, fc: frequency, and φ: phase).

The envelope detection circuit 3 extracts i/Q data from the BBIC 5, detects the high-frequency power amplitude ($\sqrt{(i^2+Q^2)}$) of the high-frequency input signal (or the high-frequency output signal), and outputs the high-frequency power amplitude to the power supply control circuit 2.

The BBIC 5 is a circuit that performs signal processing using an intermediate frequency band of lower frequencies than that of the high-frequency input signal which is inputted to the power amplification circuit 1A. The BBIC 5 has the i/Q data of the above-described high-frequency input signal.

The RFIC 4 generates the high-frequency input signal which is inputted to the power amplification circuit 1A based on the i/Q data and the like outputted from the BBIC 5.

With the above configuration, the power supply control circuit 2 receives information of the high-frequency power amplitude ($\sqrt{(i^2+Q^2)}$) of the high-frequency input signal (or the high-frequency output signal) and controls the variable voltage Vcc2 (and Vcc1). In other words, the power amplification circuit 1A varies the variable voltage Vcc2 (and Vcc1) based on an ET (envelope tracking) method that tracks the power amplitude of the high-frequency input signal. Therefore, the power amplification circuit 1A according to the variation can improve the power-added efficiency of the power amplification circuit 1A based on the ET method by the simplified configuration of the current limiting circuit 23, similarly to the power amplification circuit 1 according to the first embodiment.

Here, a relationship between high-frequency output power of the power amplification circuit 1A and the variable voltage Vcc2 (and Vcc1) in the ET method is described.

Figure 3:
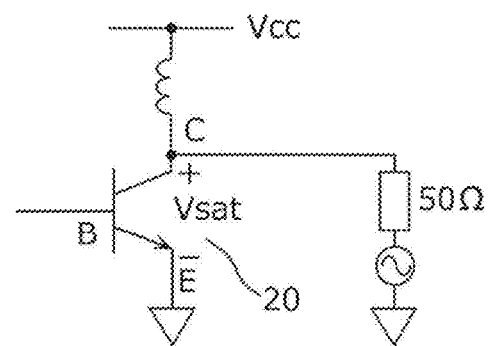
FIG. 3 is a schematic circuit diagram illustrating the connection between an amplification transistor and a peripheral circuit thereof.

FIG. 3 is a schematic circuit diagram illustrating the connection between an amplification transistor and a peripheral circuit thereof. FIG. 3 illustrates an emitter-grounded bipolar transistor, a power supply voltage Vcc, a load impedance (about 50Ω), and an inductor for impedance matching.

In the circuit illustrated in FIG. 3, when a high-frequency input signal is inputted from a base terminal and a high-frequency output signal is outputted from a collector terminal, the output power Pout of the high-frequency output signal and the power supply voltage Vcc satisfy Equation 1 below.

$$P_{out}(\text{dBm}) = 10\log\left(\frac{(2Vcc - Vsat)^2}{8R_L \times 10^{-3}}\right) \qquad \text{Equation 1}$$

In Equation 1 above, Vsat represents a collector-emitter voltage, and RL represents a load impedance and is, for example, about 50 (Ω).

When the ET method is employed as in this variation, since the amplification transistor operates in a saturation region, Vsat is substantially 0. Therefore, when Vsat=0 is substituted for Equation 1, the output power Pout (W) is represented by Equation 2, and further, a voltage component Pout (V) of the output power is represented by Equation 3.

$$P_{out}(W) = k1 \times Vcc^2 \qquad \text{Equation 2}$$

$$P_{out}(V) = k2 \times Vcc \qquad \text{Equation 3}$$

Here, k1 and k2 are constants.

As indicated in Equation 3, in the case of the ET method, the voltage component Pout (V) of the output power of the high-frequency output signal is expressed as a linear function of the power supply voltage Vcc. Thus, in the power amplification circuit 1A according to the variation, when the current limiting circuit 23 is operated, the power level of the high-frequency signal is not monitored but the power supply voltage Vcc having the linear (linear function) relationship with the power level is monitored.

More specifically, the current limiting circuit 23 monitors the variable voltage Vcc2 (and Vcc1) with the ET method, and causes a sufficient DC bias current to flow through the bias circuit 22 at a high variable voltage Vcc2 (and Vcc1) (≈high high-frequency signal power) and prevents the DC bias current from unnecessarily flowing through the bias circuit 22 at a low variable voltage Vcc2 (and Vcc1) (≈low high-frequency signal power). Thus, since a collector current (driving current) Icc2 adapted to the ET method can be made to flow, it is possible to effectively improve the power-added efficiency of the power amplification circuit 1A based on the ET method.

3. Amplification Characteristics of Power Amplification Circuit

Figure 4A:
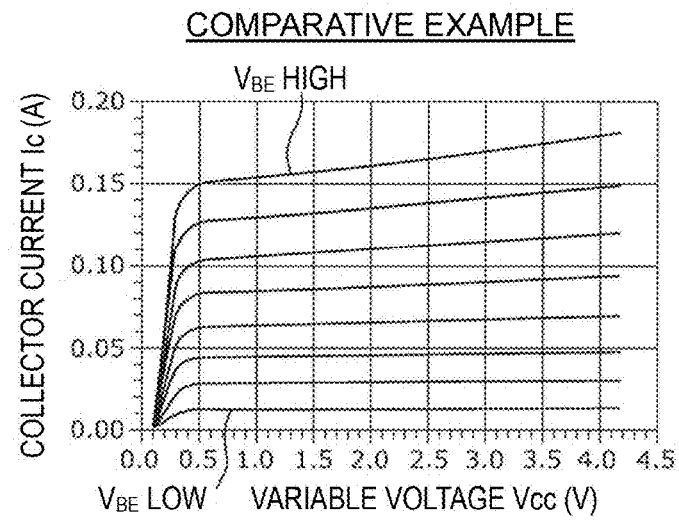
FIG. 4A is a graph illustrating a relationship between a power supply voltage and a collector current in a power amplification circuit according to a comparative example.
Figure 4B:
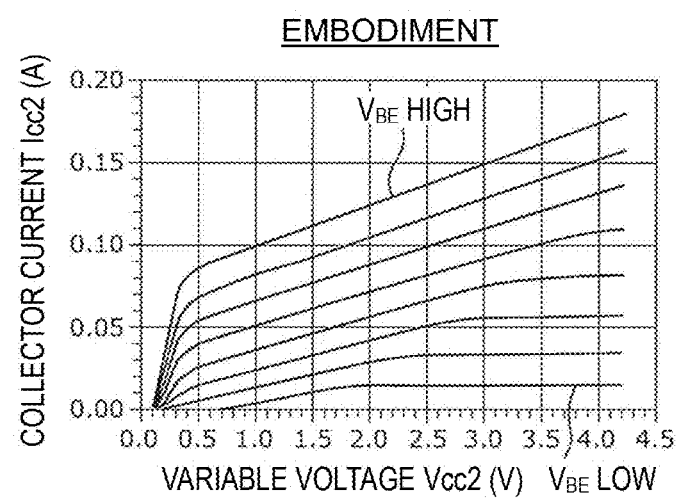
FIG. 4B is a graph illustrating a relationship between a power supply voltage and a collector current in the power amplification circuit according to the first embodiment.

FIG. 4A is a graph illustrating a relationship between a variable voltage Vcc and a collector current Ic in a power amplification circuit according to a comparative example. FIG. 4B is a graph illustrating a relationship between the variable voltage Vcc2 and the collector current Icc2 in the power amplification circuit 1 according to the first embodiment. Note that the power amplification circuit according to the comparative example has a circuit configuration in which no current limiting circuit 23 in the power amplifying circuit 1 according to the first embodiment is provided and the bias circuit 22 is directly connected to the base terminal of the amplification transistor 20.

FIGS. 4A and 4B illustrate static characteristics (DC characteristics) of the variable voltage and the collector current when a base-emitter voltage (VBE) of the amplification transistor 20 is changed.

In the power amplification circuit according to the comparative example, as illustrated in FIG. 4A, the collector current Ic is substantially constant for change in the variable voltage Vcc (about 0.5 V to about 4.0 V). In the power amplification circuit according to the comparative example, even if the variable voltage Vcc is decreased in accordance with the power amplitude of the high-frequency signal by the ET method, for example, a DC bias current (base-emitter current) which is supplied directly to the base terminal of the amplification transistor 20 from the bias circuit 22 is substantially constant by a constant current outputted from the constant current source 24. Therefore, the collector current Ic flowing in dependence on the DC bias current is also substantially constant regardless of the decrease in the variable voltage Vcc.

On the other hand, in the power amplification circuit 1 according to the embodiment, as illustrated in FIG. 4B, the collector current Icc2 decreases in accordance with the decrease in the variable voltage Vcc2 (about 0.5 V to about 4.0 V). In the power amplification circuit 1 according to the embodiment, the collector current Icc2 decreases because the current limiting circuit 23 limits (decreases) the DC bias current Ief which is outputted from the bias circuit 22 in accordance with the decrease in the variable voltage Vcc2. In other words, in the power amplification circuit 1 according to the embodiment, when the variable voltage Vcc2 is decreased in accordance with the power amplitude of the high-frequency signal by the ET method, for example, the DC bias current Ief (base-emitter current) which is supplied from the bias circuit 22 to the base terminal of the amplification transistor 20 is limited by the current limiting circuit 23 to be decreased. Therefore, the collector current Icc2 flowing in dependence on the DC bias current Ief also decreases in accordance with the decrease in the variable voltage Vcc2.

Figure 5A:
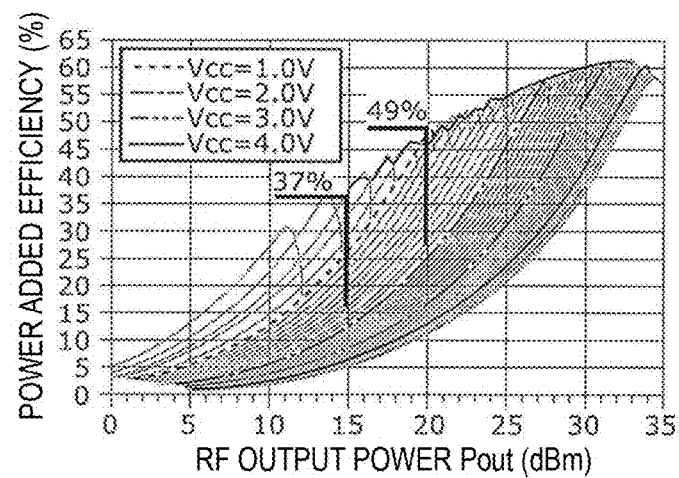
FIG. 5A is a graph illustrating a relationship between high-frequency output power and power-added efficiency in the power amplification circuit according to the comparative example.
Figure 5B:
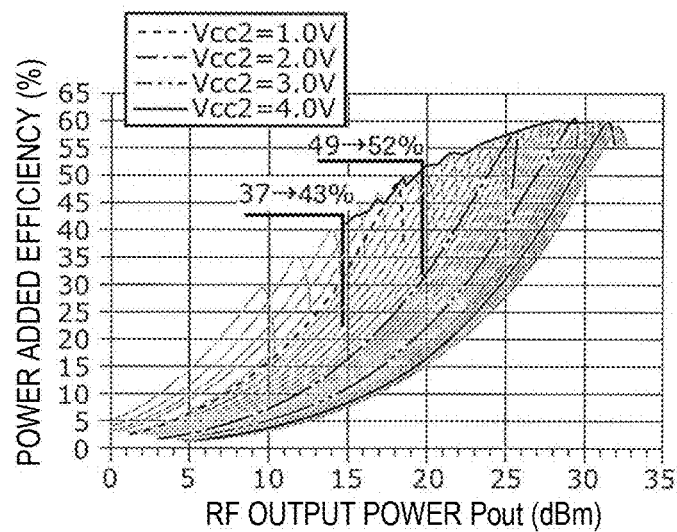
FIG. 5B is a graph illustrating a relationship between high-frequency output power and power-added efficiency in the power amplification circuit according to the first embodiment.

FIG. 5A is a graph illustrating a relationship between high-frequency output power and power-added efficiency in the power amplification circuit according to the comparative example. FIG. 5B is a graph illustrating a relationship between the high-frequency output power and the power-added efficiency in the power amplification circuit 1 according to the first embodiment. More specifically, FIG. 5A illustrates the characteristics of the high-frequency output power Pout versus the power-added efficiency when the variable voltage Vcc is changed by the ET method in the power amplification circuit according to the comparative example. Further, FIG. 5B illustrates the characteristics of the high-frequency output power Pout versus the power-added efficiency when the variable voltage Vcc2 is changed by the ET method in the power amplification circuit 1 according to the first embodiment.

As illustrated in FIG. 5A and FIG. 5B, as the variable voltage Vcc2 (or Vcc) is decreased at predetermined high-frequency output power Pout, the power-added efficiency increases. However, comparing FIG. 5A and FIG. 5B with each other, for example, when the high-frequency output power Pout is about 20 dBm, the power amplification circuit (FIG. 5A) according to the comparative example has the power-added efficiency of about 49% whereas the power amplification circuit (FIG. 5B) according to the first embodiment has the improved power-added efficiency of about 52%. Further, when the high-frequency output power Pout is about 15 dBm, the power amplification circuit (FIG. 5A) according to the comparative example has the power-added efficiency of about 37% whereas the power amplification circuit 1 (FIG. 5B) according to the first embodiment has the improved power-added efficiency of about 43%.

When the variable voltage Vcc2 (or Vcc) is decreased in accordance with the power amplitude of the high-frequency signal by the ET method, the power-added efficiency increases with the decrease in the variable voltage. However, in the power amplification circuit according to the comparative example, although the variable voltage Vcc decreases, the collector current Ic is substantially constant. On the other hand, in the power amplification circuit 1 according to the first embodiment, as the variable voltage Vcc2 decreases, the collector current Icc2 also decreases. Therefore, in the power amplification circuit 1 according to the first embodiment, it is possible to effectively improve the power-added efficiency defined by the product of the variable voltage Vcc2 (and Vcc1) and the collector current Icc2.

Next, the operations of the current limiting circuit 23 according to the embodiment will be described.

FIGS. 6A to 6F are graphs for explaining the operations of the current limiting circuit 23 according to the first embodiment. FIG. 6A is a graph illustrating a relationship between a collector-emitter voltage Vce (see FIG. 1) of the current limiting transistor 230 and the variable voltage Vcc2. FIG. 6B is a graph illustrating a relationship between the DC bias current Ief (see FIG. 1) which is outputted from the bias circuit 22 to the base terminal of the amplification transistor 20 and the variable voltage Vcc2. FIG. 6C is a graph illustrating a relationship between the collector current Icc2 (see FIG. 1) of the amplification transistor 20 and the variable voltage Vcc2. FIG. 6D is a graph illustrating a relationship between a current Isub_c (see FIG. 1) flowing through the resistor element 232 from the variable voltage power supply 11 (or 21) toward the collector terminal of the current limiting transistor 230 and the variable voltage Vcc2. FIG. 6E is a graph illustrating a relationship between a current Isub_b (see FIG. 1) flowing through the resistor element 231 from the bias circuit 22 toward the base terminal of the current limiting transistor 230 and the variable voltage Vcc2. FIG. 6F is a graph illustrating a relationship between a current Isub (see FIG. 1) flowing from the emitter terminal of the current limiting transistor 230 toward a connection point of the current limiting circuit 23 and the bias circuit 22 and the variable voltage Vcc2. Here, Isub=Isub_b+Isub_c is satisfied.

When the variable voltage Vcc2 (and Vcc1) decreases and becomes lower than 1.5 V, a collector potential of the current limiting transistor 230 becomes lower than a base potential thereof and a current flows from the base terminal of the current limiting transistor 230 toward the collector terminal thereof (Isub_c becomes a negative current in FIG. 6D). At this time, the constant current which is supplied to the base terminal of the constant current amplification transistor 220 of the bias circuit 22 is partially branched toward the resistor element 231 and Isub_b flows (Isub_b becomes a positive current in FIG. 6E). Thus, the DC bias current Ief which is outputted from the emitter terminal of the constant current amplification transistor 220 decreases in accordance with the amount of the constant current, which has been branched toward the resistor element 231 (Ief decreases in FIG. 6B). As the DC bias current Ief decreases, the collector current Icc2 also decreases (FIG. 6C). In other words, the current limiting circuit 23 takes in the constant current before the current is amplified into the DC bias current Ief in accordance with the decrease in the variable voltage Vcc2, thereby decreasing the DC bias current Ief. Note that since the current Isub_b flowing as a result of branching of the constant current toward the resistor element 231 is a current level before the current is amplified into the DC bias current Ief, the current Isub flowing toward the connecting point of the current limiting circuit 23 and the bias circuit 22 is also sufficiently smaller than the DC bias current Ief (in FIG. 6F). Therefore, the current Isub does not affect increase or decrease in the DC bias current Ief regardless of increase and decrease in the variable voltage Vcc2.

In other words, when the variable voltage Vcc2 (and Vcc1) becomes lower than the reference voltage, as the potential difference between the reference voltage and the variable voltage Vcc2 (and Vcc1) becomes larger, the current limiting circuit 23 increases the DC limiting current (−Isub_c) as the DC current flowing to the collector terminal of the current limiting transistor 230 from the base terminal of the constant current amplification transistor 220 while flowing through the base terminal of the current limiting transistor 230.

By the above operations of the current limiting circuit 23, a simplified circuit including the one current limiting transistor 230 and the two resistor elements 231 and 232 can decrease the collector current Icc2 of the amplification transistor 20 with the decrease in the variable voltage Vcc2.

As described with reference to FIGS. 6A to 6F, the current limiting circuit 23 according to the embodiment can effectively improve the power-added efficiency at intermediate power about 20 dBm) and low power (<about 15 dBm).

In the current limiting circuit 23, a resistor element may be inserted in series into the emitter terminal of the current limiting transistor 230. Thus, it is possible to adjust a rate of change in the DC bias current Ief relative to change in the variable voltage Vcc2 (and Vcc1).

4. Configuration of Power Amplification Circuit According to Second Variation

Figure 7A:
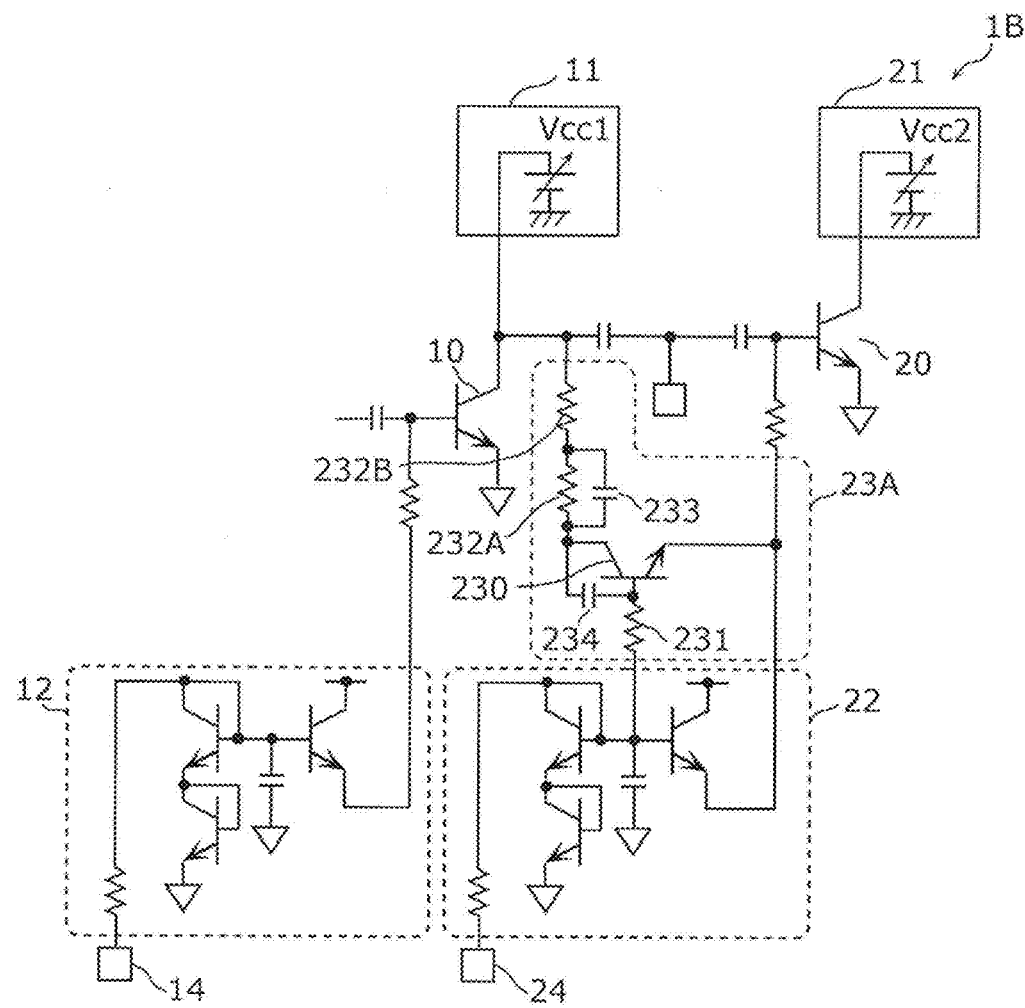
FIG. 7A is a configuration diagram of a power amplification circuit and a peripheral circuit thereof according to a second variation of the first embodiment.

FIG. 7A is a configuration diagram of a power amplification circuit 1B and a peripheral circuit thereof according to a second variation of the first embodiment. FIG. 7A illustrates the power amplification circuit 1B according to the variation and the constant current sources 14 and 24. As illustrated in FIG. 7A, the power amplification circuit 1B includes the high-frequency input terminal 100, the high-frequency output terminal 200, the amplification transistors 10 and 20, the variable voltage power supplies 11 and 21, the bias circuits 12 and 22, and a current limiting circuit 23A. The power amplification circuit 1B further includes resistor elements, capacitors, and an impedance matching circuit in the same manner as the power amplification circuit 1 according to the first embodiment. The power amplification circuit 1B illustrated in FIG. 7A is different from the power amplification circuit 1 according to the first embodiment in the configuration of the current limiting circuit 23A. Hereinafter, for the power amplification circuit 1B according to the variation, the description of the same configurations as those of the power amplification circuit 1 according to the first embodiment will be omitted and description will be mainly made on different configurations.

The current limiting circuit 23A limits the DC bias current which is outputted from the bias circuit 22. More specifically, the current limiting circuit 23A includes the current limiting transistor 230, the resistor element 231, resistor elements 232A and 232B, and capacitors 233 and 234.

The current limiting transistor 230 has the collector terminal (fifth terminal), the emitter terminal (sixth terminal), and the base terminal (third control terminal), and the emitter terminal (sixth terminal) thereof is connected to the emitter terminal (fourth terminal) of the constant current amplification transistor 220.

The resistor element 231 is the second resistor element one end of which is connected to the base terminal (third control terminal) of the current limiting transistor 230 and the other end of which is connected to the base terminal (second control terminal) of the constant current amplification transistor 220.

The resistor element 232A is a first split resistor one end of which is connected to the collector terminal (fifth terminal) of the current limiting transistor 230 and the other end of which is connected to one end of the resistor element 232B. The resistor element 232B is a second split resistor the other end of which is connected to the variable voltage power supply 11. Note that the above-described other end of the resistor element 232B may be connected to the variable voltage power supply 21.

The capacitor 233 is a first capacitive element connected in parallel to the resistor element 232A. The capacitor 234 is a second capacitive element connected between the base terminal (third control terminal) of the current limiting transistor 230 and the collector terminal (fifth terminal) thereof.

Note that a resistor element may be inserted in series between the emitter terminal of the current limiting transistor 230 and the emitter terminal of the constant current amplification transistor 220. Thus, it is possible to adjust a rate of change in the DC bias current Ief relative to change in the variable voltage Vcc2 (and Vcc1).

5. Configuration of Power Amplification Circuit According to Third Variation

Figure 7B:
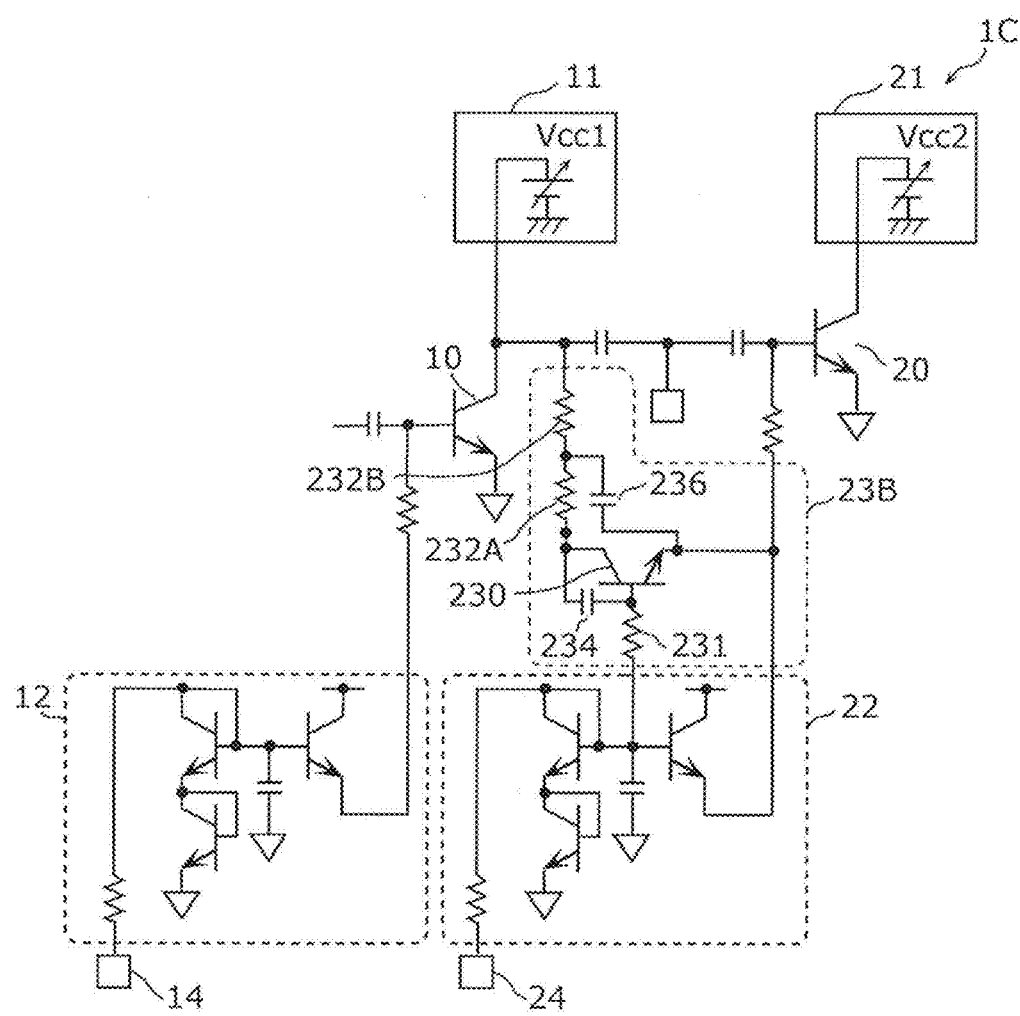
FIG. 7B is a configuration diagram of a power amplification circuit and a peripheral circuit thereof according to a third variation of the first embodiment.

FIG. 7B is a configuration diagram of a power amplification circuit 1C and a peripheral circuit thereof according to a third variation of the first embodiment. FIG. 7B illustrates the power amplification circuit 1C according to the variation and the constant current sources 14 and 24. As illustrated in FIG. 7B, the power amplification circuit 1C includes the high-frequency input terminal 100, the high-frequency output terminal 200, the amplification transistors 10 and 20, the variable voltage power supplies 11 and 21, the bias circuits 12 and 22, and a current limiting circuit 23B. The power amplification circuit 1C further includes resistor elements, capacitors, and an impedance matching circuit in the same manner as the power amplification circuit 1 according to the first embodiment. The power amplification circuit 1C illustrated in FIG. 7B is different from the power amplification circuit 1 according to the first embodiment in the configuration of the current limiting circuit 23B. Hereinafter, for the power amplification circuit 1C according to the variation, the description of the same configurations as those of the power amplification circuit 1 according to the first embodiment will be omitted and description will be mainly made on different configurations.

The current limiting circuit 23B limits the DC bias current which is outputted from the bias circuit 22. More specifically, the current limiting circuit 23B includes the current limiting transistor 230, the resistor elements 231, 232A, and 232B, and the capacitor 234 and a capacitor 236.

The current limiting transistor 230 has the collector terminal (fifth terminal), the emitter terminal (sixth terminal), and the base terminal (third control terminal), and the emitter terminal (sixth terminal) thereof is connected to the emitter terminal (fourth terminal) of the constant current amplification transistor 220 with a resistor element 235 interposed therebetween.

The resistor element 231 is the second resistor element one end of which is connected to the base terminal (third control terminal) of the current limiting transistor 230 and the other end of which is connected to the base terminal (second control terminal) of the constant current amplification transistor 220.

The resistor element 232A is the first split resistor one end of which is connected to the collector terminal (fifth terminal) of the current limiting transistor 230 and the other end of which is connected to one end of the resistor element 232B. The resistor element 232B is the second split resistor the other end of which is connected to the variable voltage power supply 11. Note that the other end of the resistor element 232B may be connected to the variable voltage power supply 21.

The capacitor 236 is a first capacitive element connected between a connection point of the resistor elements 232A and 232B and the emitter terminal (sixth terminal) of the current limiting transistor 230. The capacitor 234 is the second capacitive element connected between the base terminal (third control terminal) of the current limiting transistor 230 and the collector terminal (fifth terminal) thereof.

Note that a resistor element may be inserted in series between the emitter terminal of the current limiting transistor 230 and the emitter terminal of the constant current amplification transistor 220. Thus, it is possible to adjust a rate of change in the DC bias current Ief relative to change in the variable voltage Vcc2 (and Vcc1).

Figure 8A:
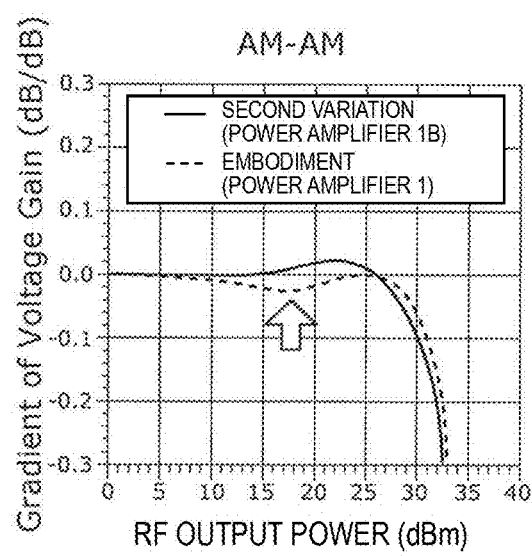
FIG. 8A is a graph when AM-AM characteristics of the power amplification circuit according to the first embodiment and the power amplification circuit according to the second variation are compared.
Figure 8B:
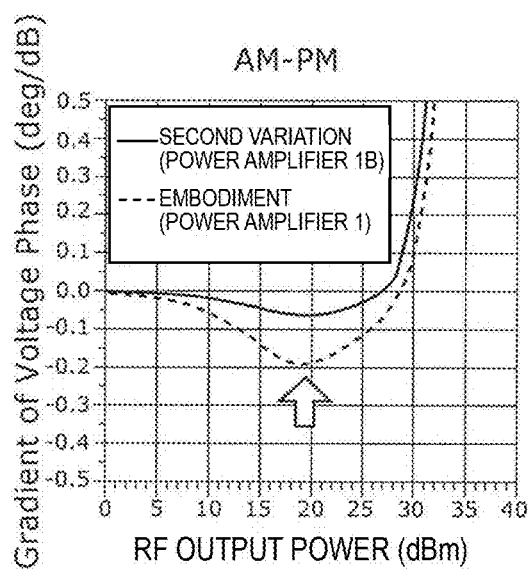
FIG. 8B is a graph when AM-PM characteristics of the power amplification circuit according to the first embodiment and the power amplification circuit according to the second variation are compared.

6. Distortion Characteristics of Power Amplification Circuits According to Second Variation and Third Variation FIG. 8A is a graph when AM (amplitude modulation)-AM (amplitude modulation) characteristics of the power amplification circuit 1 according to the first embodiment and the power amplification circuit 1B according to the second variation are compared. FIG. 8B is a graph when the AM (amplitude modulation)-PM (phase modulation) characteristics of the power amplification circuit 1 according to the first embodiment and the power amplification circuit 1B according to the second variation are compared. Here, the AM-AM characteristics are characteristics representing a ratio between an input signal amplitude and an output signal amplitude of the power amplification circuit. Further, the AM-PM characteristics are characteristics representing a ratio between an input signal amplitude and an output signal phase of the power amplification circuit. FIG. 8A illustrates a relationship between the high-frequency output power and the AM-AM characteristics, and FIG. 8B illustrates a relationship between the high-frequency output power and the AM-PM characteristics.

As compared with the power amplification circuit 1 according to the first embodiment, the power amplification circuit 1B according to the second variation is closer to 0 in both of the AM-AM characteristics (gradient of voltage gain) and the AM-PM characteristics (gradient of voltage phase). In other words, in the power amplification circuit 1B according to the second variation, nonlinearity is improved and distortion characteristics can be improved by adding the capacitors 233 and 234 in the current limiting circuit 23A.

Note that the power amplification circuit 1C according to the third variation is also similar to the power amplification circuit 1B according to the second variation, and nonlinearity is improved and distortion characteristics can be improved by adding the capacitors 234 and 236 in the current limiting circuit 23B.

Second Embodiment

In the first embodiment, the configuration has been described, as the example, in which the current limiting circuit 23 is connected to the amplification transistor 20 of the posterior stage (power stage) in the two-stage power amplification circuit 1 including the amplification transistors 10 and 20 that are cascade-connected. In contrast, in this embodiment, the configuration in which a current limiting circuit is connected to the amplification transistor 10 of the anterior stage (drive stage) is described as an example.

Figure 9:
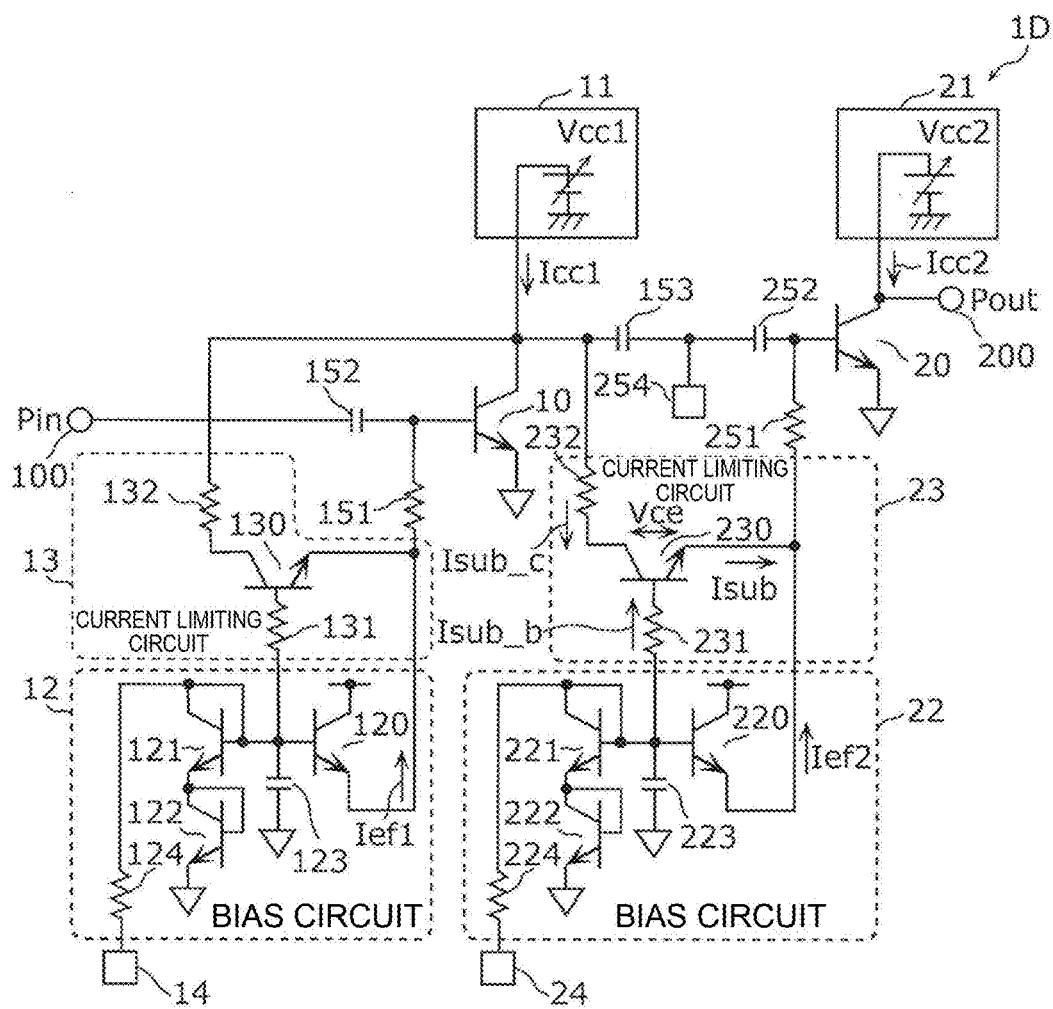
FIG. 9 is a configuration diagram of a power amplification circuit and a peripheral circuit thereof according to a second embodiment.

FIG. 9 is a configuration diagram of a power amplification circuit 1D and a peripheral circuit thereof according to the second embodiment. FIG. 9 illustrates the power amplification circuit 1D according to the embodiment and the constant current sources 14 and 24. As illustrated in FIG. 9, the power amplification circuit 1D includes the high-frequency input terminal 100, the high-frequency output terminal 200, the amplification transistors 10 and 20, the variable voltage power supplies 11 and 21, the bias circuits 12 and 22, current limiting circuits 13 and 23, the resistor elements 151 and 251, the capacitors 152, 153 and 252, and the impedance matching circuit 254.

With the above configuration, the power amplification circuit 1D amplifies a high-frequency signal inputted from the high-frequency input terminal 100 by the amplification transistors 10 and 20 and outputs the amplified high-frequency signal from the high-frequency output terminal 200.

The power amplification circuit 1D according to the second embodiment is different from the power amplification circuit 1 according to the first embodiment in that the current limiting circuit 13 is added. Hereinafter, for the power amplification circuit 1D according to the embodiment, the description of the same configurations as those of the power amplification circuit 1 according to the first embodiment will be omitted and description will be mainly made on different configurations.

The amplification transistor 10 is an anterior-stage (drive-stage) first amplification transistor that has a base terminal (first control terminal), a collector terminal (first terminal), and an emitter terminal (second terminal), performs power amplification on the high-frequency signal inputted from the base terminal (first control terminal), and outputs, from the collector terminal (first terminal), the high-frequency signal on which the power amplification has been performed.

The amplification transistor 20 is a posterior-stage (power-stage) first amplification transistor that has a base terminal (first control terminal), a collector terminal (first terminal), and an emitter terminal (second terminal), performs power amplification on the high-frequency signal inputted from the base terminal (first control terminal), and outputs, from the collector terminal (first terminal) thereof, the high-frequency signal on which the power amplification has been performed.

The bias circuit 12 outputs an effective DC bias current Ief1 toward the base terminal of the amplification transistor 10. More specifically, the bias circuit 12 includes the constant current amplification transistor 120, the diode-connected transistors 121 and 122, the capacitor 123, and the resistor element 124.

The constant current amplification transistor 120 has a collector terminal (third terminal), an emitter terminal (fourth terminal), and a base terminal (second control terminal) and outputs the DC bias current Ief1 thereof from the emitter terminal (fourth terminal) toward the base terminal (first control terminal) of the amplification transistor 10. With this configuration, a constant current outputted from the constant current source 14 is inputted to the base terminal of the constant current amplification transistor 120 and is amplified to be the DC bias current Ief1. Then, the DC bias current Ief1 is supplied to the base terminal of the amplification transistor 10 from the emitter terminal (fourth terminal) of the constant current amplification transistor 120 while flowing through the resistor element 151.

The bias circuit 22 outputs an effective DC bias current Ief2 toward the base terminal of the amplification transistor 20. More specifically, the bias circuit 22 includes the constant current amplification transistor 220, the diode-connected transistors 221 and 222, the capacitor 223, and the resistor element 224.

The constant current amplification transistor 220 has a collector terminal (third terminal), an emitter terminal (fourth terminal), and a base terminal (second control terminal) and outputs the DC bias current Ief2 from the emitter terminal (fourth terminal) thereof toward the base terminal (first control terminal) of the amplification transistor 20. With this configuration, a constant current outputted from the constant current source 24 is inputted to the base terminal of the constant current amplification transistor 220 and is amplified to be the DC bias current Ief2. Then, the DC bias current Ief2 is supplied to the base terminal of the amplification transistor 20 from the emitter terminal (fourth terminal) of the constant current amplification transistor 220 while flowing through the resistor element 251.

The current limiting circuit 13 limits the DC bias current which is outputted from the bias circuit 12. More specifically, the current limiting circuit 13 includes a current limiting transistor 130 and resistor elements 131 and 132.

The current limiting transistor 130 has a collector terminal (fifth terminal), an emitter terminal (sixth terminal), and a base terminal (third control terminal), and the emitter terminal (sixth terminal) thereof is connected to the emitter terminal (fourth terminal) of the constant current amplification transistor 120.

The resistor element 132 is a first resistor element one end of which is connected to the collector terminal (fifth terminal) of the current limiting transistor 130 and the other end of which is connected to the variable voltage power supply 11. Note that the other end of the resistor element 132 may be connected to the variable voltage power supply 21.

The resistor element 131 is a second resistor element one end of which is connected to the base terminal (third control terminal) of the current limiting transistor 130 and the other end of which is connected to the base terminal (second control terminal) of the constant current amplification transistor 120.

With the above connection configuration, when the variable voltage Vcc1 (Vcc2) becomes lower than a reference voltage, as a potential difference between the variable voltage Vcc1 (Vcc2) and the reference voltage is larger, the current limiting circuit 13 increases a DC limiting current as a DC current flowing to the collector terminal (fifth terminal) of the current limiting transistor 130 from the base terminal (second control terminal) of the constant current amplification transistor 120 while flowing through the base terminal (third control terminal) of the current limiting transistor 130. The reference voltage is, for example, a maximum variable voltage that is set when the high-frequency input signal inputted to the power amplification circuit 1D has a maximum power amplitude.

The current limiting circuit 23 limits the DC bias current which is outputted from the bias circuit 22. More specifically, the current limiting circuit 23 includes the current limiting transistor 230 and the resistor elements 231 and 232.

The current limiting transistor 230 has a collector terminal (fifth terminal), an emitter terminal (sixth terminal), and a base terminal (third control terminal), and the emitter terminal (sixth terminal) thereof is connected to the emitter terminal (fourth terminal) of the constant current amplification transistor 220.

The resistor element 232 is a first resistor element one end of which is connected to the collector terminal (fifth terminal) of the current limiting transistor 230 and the other end of which is connected to the variable voltage power supply 11. Note that the other end of the resistor element 232 may be connected to the variable voltage power supply 21.

The resistor element 231 is a second resistor element one end of which is connected to the base terminal (third control terminal) of the current limiting transistor 230 and the other end of which is connected to the base terminal (second control terminal) of the constant current amplification transistor 220.

With the above connection configuration, when the variable voltage Vcc1 (Vcc2) becomes lower than the reference voltage, as the potential difference between the variable voltage Vcc1 (Vcc2) and the reference voltage is larger, the current limiting circuit 23 increases the DC limiting current as the DC current flowing to the collector terminal (fifth terminal) of the current limiting transistor 230 from the base terminal (second control terminal) of the constant current amplification transistor 220 while flowing through the base terminal (third control terminal) of the current limiting transistor 230.

In other words, the power amplification circuit 1D according to the embodiment includes a plurality of amplification transistors connected in cascade, which includes the amplification transistors 10 and 20 as the first amplification transistors. Further, among the plurality of amplification transistors described above, the amplification transistor 20 arranged at the last stage closest to the output terminal of the power amplification circuit 1D is the above-described first amplification transistor. At the last stage, the variable voltage power supply 21, the bias circuit 22, and the current limiting circuit 23 are arranged. Further, among the plurality of amplification transistors described above, the amplification transistor 10 arranged at at least one anterior stage relative to the last stage closest to the output terminal of the power amplification circuit 1D is the above-described first amplification transistor. At the anterior stage, the variable voltage power supply 11, the bias circuit 12, and the current limiting circuit 13 are arranged.

This configuration limits the base currents (base-emitter currents) of the amplification transistors 10 and 20 with decrease in the variable voltage Vcc2 (and Vcc1), so that the collector currents (collector-emitter currents) of the amplification transistors 10 and 20 can be decreased. In other words, since the optimum DC bias currents Ief2 and Ief1 in accordance with the magnitude of the variable voltage Vcc1 (and Vcc2) can be made to flow, it is possible to improve the PAE (power-added efficiency) of the power amplification circuit 1D. Note that the circuit operations of the current limiting circuits 13 and 23 are the same as the circuit operations (FIGS. 6A to 6F) of the current limiting circuit 23 in the first embodiment, and the description thereof will therefore be omitted in this embodiment.

In addition, the current limiting circuit 13 or 23 configured by the one transistor (current limiting transistor 130 or 230) and the two resistor elements 231 and 232 (or the resistor elements 131 and 132) limits the DC bias currents Ief1 and Ief2 for optimizing operating points of the amplification transistors 10 and 20 with decrease in the variable voltage Vcc2 (and Vcc1) driving the amplification transistors 10 and 20. As a result, the current limiting circuits 13 and 23 can be realized by simplified circuit configurations, which can contribute to the miniaturization of the power amplification circuit 1D.

Figure 10:
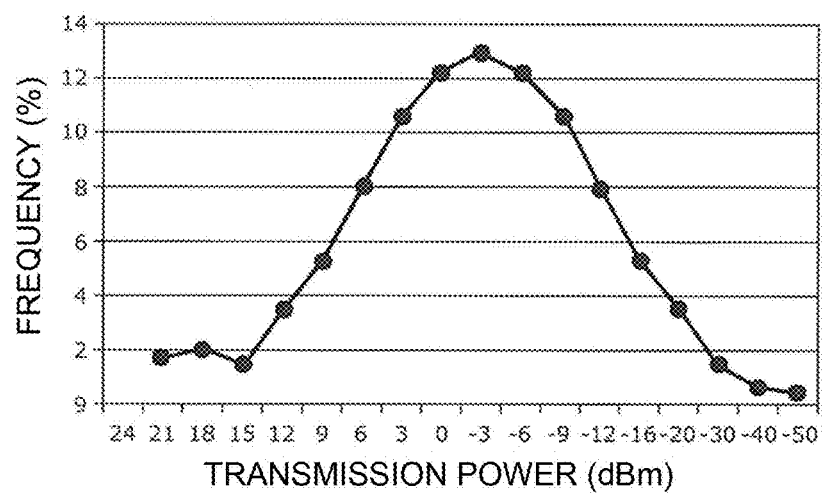
FIG. 10 is a graph illustrating a relationship between transmission power of a portable terminal and frequency thereof.

FIG. 10 is a graph illustrating a relationship between transmission power of a portable terminal and frequency thereof. FIG. 10 illustrates distribution of the transmission power in WCDMA (registered trademark) (Wideband Code Division Multiple Access) and specifically illustrates the frequency of use for each transmission power in WCDMA (registered trademark). As illustrated in FIG. 10, it can be seen that the frequency of the transmission power of equal to or lower than about 0 dBm occupies equal to or higher than about 50%. Thus, it can be understood that reduction in current consumption of the power amplification circuit when low transmission power of equal to or lower than about 0 dBm is used greatly contributes to reduction in power consumption of the portable terminal and increase in operation time of a battery thereof.

Figure 11A:
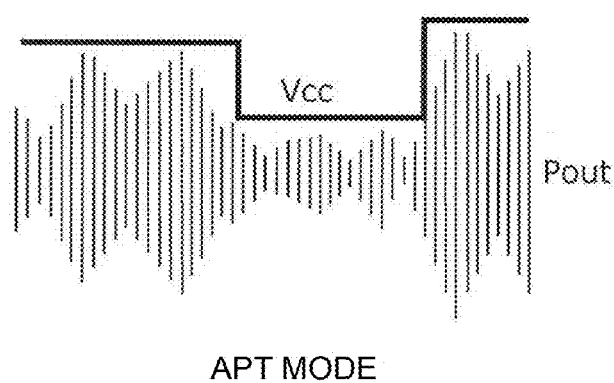
FIG. 11A is a schematic waveform diagram for explaining an APT mode.
Figure 11B:
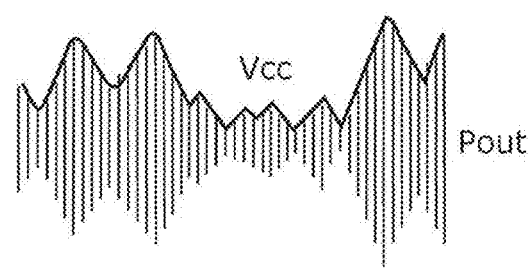
FIG. 11B is a schematic waveform diagram for explaining an ET mode.

FIG. 11A is a schematic waveform diagram illustrating an APT (average power tracking) mode. Further, FIG. 11B is a schematic waveform diagram illustrating an ET (envelope tracking) mode. As described in the first embodiment, the ET mode is a mode in which the power amplitude (envelope) of the high-frequency signal is tracked and the voltage supply level to the power amplification circuit is varied in accordance with the envelope. By contrast, the APT mode is a mode in which an average power amplitude of the high-frequency signal, which is calculated every predetermined time period, is tracked and the voltage supply level to the power amplification circuit is varied in accordance with the average power amplitude.

In the case of the ET mode, as in the power amplification circuit 1 according to the first embodiment, arrangement of the current limiting circuit 23 at the posterior stage (power stage) can improve the power-added efficiency (PAE). On the other hand, in the case of the APT mode, as in the power amplification circuit 1D according to the embodiment, arrangement of the current limiting circuit 13 at the anterior stage (drive stage) can reduce the collector current Icc1 in accordance with the variable voltage at a low output level with the high-frequency output power (RF output power Pout) of equal to or lower than about 0 dBm, for example, in the same way as the characteristics illustrated in FIG. 4B. Therefore, it is possible to realize a low collector current Icc1 that follows the low output power, and thus it is possible to effectively improve the PAE (power-added efficiency).

FIG. 12A is a graph illustrating relationships between high-frequency output power (RF output power Pout) and gain (Gain), an APT variable voltage (APT Vcc), and a noise level in E-UTRA (E-UTRA) in a power amplification circuit according to a comparative example. FIG. 12B is a graph illustrating relationships between the high-frequency output power (RF output power Pout) and gain (Gain), an APT variable voltage (APT Vcc), and a noise level in E-UTRA (E-UTRA) in the power amplification circuit according to the second embodiment.

Note that the power amplification circuit according to the comparative example has a circuit configuration in which the current limiting circuits 13 and 23 in the power amplifying circuit 1D according to the second embodiment are not provided, the bias circuit 12 is directly connected to the base terminal of the amplification transistor 10, and the bias circuit 22 is directly connected to the base terminal of the amplification transistor 20.

In both of the power amplification circuit according to the comparative example and the power amplification circuit 1D according to the second embodiment, the variable voltage Vcc1 (Vcc2) is adjusted in accordance with the magnitude of the high-frequency output power by adopting the APT mode (APT Vcc (V) in FIGS. 12A and 12B). However, in a region where the high-frequency output power is low, the gain of the power amplification circuit 1D according to the second embodiment is lower. With the power amplification circuit 1D according to the second embodiment, since the base currents (base-emitter current) of the amplification transistors 10 and 20 increase or decrease in accordance with increase or decrease in the variable voltage Vcc1 (Vcc2), it is possible to suppress the gain.

FIG. 13A is a graph illustrating relationships between the high-frequency output power (RF output power Pout) and the gain (Gain), a collector current Icc (the sum of collector currents Icc1 and Icc2), and the noise level in E-UTRA (E-UTRA) in the power amplification circuit according to the comparative example. FIG. 13B is a graph illustrating relationships between the high-frequency output power (RF output power Pout) and the gain (Gain), the collector current Icc (the sum of the collector currents Icc1 and Icc2), and the noise level in E-UTRA (E-UTRA) in the power amplification circuit according to the second embodiment. In a region in which the high-frequency output power is low, the collector current Icc of the power amplification circuit 1D according to the second embodiment is lower. With the power amplification circuit 1D according to the second embodiment, it is possible to reduce the collector current by varying the base currents (base-emitter currents) of the amplification transistors 10 and 20 to minimum levels in accordance with the decrease in the variable voltage Vcc1 (Vcc2).

With the power amplification circuit 1D according to the embodiment, since the current limiting circuit 13 is connected to the amplification transistor 10 of the anterior stage (drive stage), it is possible to effectively improve the PAE (power-added efficiency) in the case of the APT mode. Further, since the current limiting circuit 23 is connected to the amplification transistor 20 of the posterior stage (power stage), the optimum DC bias current Ief in accordance with the magnitude of the variable voltage can be made to flow at the last stage at which the power level of the high-frequency signal becomes the highest. Therefore, it is possible to effectively improve the PAE (power-added efficiency) in the case of the ET mode.

Figure 14:
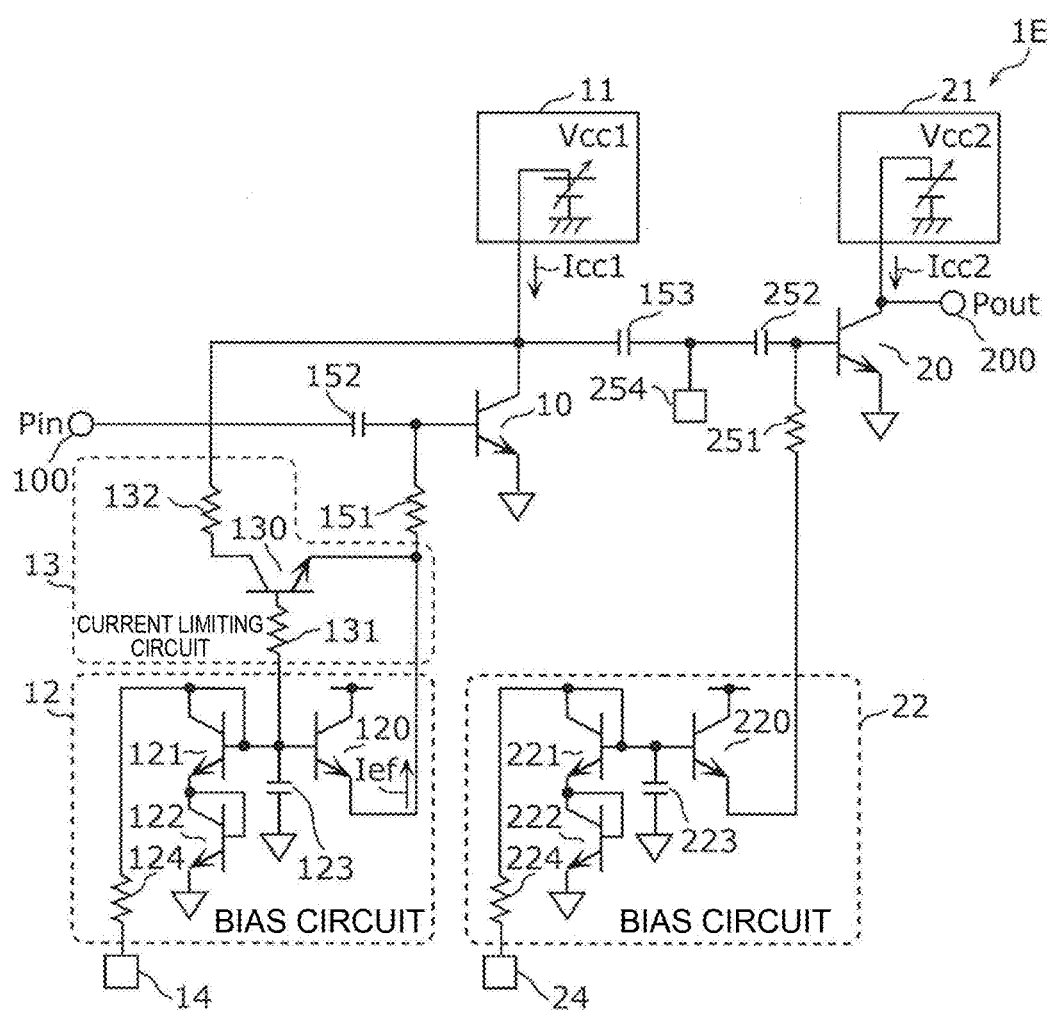
FIG. 14 is a configuration diagram of a power amplification circuit and a peripheral circuit thereof according to a variation of the second embodiment.

FIG. 14 is a configuration diagram of a power amplification circuit 1E and a peripheral circuit thereof according to a variation of the second embodiment. FIG. 14 illustrates the power amplification circuit 1E according to the variation and the constant current sources 14 and 24. As illustrated in FIG. 14, the power amplification circuit 1E includes the high-frequency input terminal 100, the high-frequency output terminal 200, the amplification transistors 10 and 20, the variable voltage power supplies 11 and 21, the bias circuits 12 and 22, the current limiting circuit 13, the resistor elements 151 and 251, the capacitors 152, 153, and 252, and the impedance matching circuit 254.

With the above configuration, the power amplification circuit 1E amplifies a high-frequency signal inputted from the high-frequency input terminal 100 by the amplification transistors 10 and 20 and outputs the amplified high-frequency signal from the high-frequency output terminal 200.

The power amplification circuit 1E according to the variation is different from the power amplification circuit 1D according to the second embodiment in that no current limiting circuit 23 is added. Hereinafter, for the power amplification circuit 1E according to the variation, the description of the same configurations as those of the power amplification circuit 1D according to the second embodiment will be omitted and description will be mainly made on different configurations.

The amplification transistor 20 is a posterior-stage amplification transistor that has a base terminal, a collector terminal, and an emitter terminal, performs power amplification on the high-frequency signal inputted from the base terminal, and outputs, from the collector terminal thereof, the high-frequency signal on which the power amplification has been performed.

The bias circuit 22 outputs a DC bias current toward the base terminal of the amplification transistor 20. More specifically, the bias circuit 22 includes the constant current amplification transistor 220, the diode-connected transistors 221 and 222, the capacitor 223, and the resistor element 224.

The constant current amplification transistor 220 has a collector terminal, an emitter terminal, and a base terminal, and outputs the DC bias current from the emitter terminal thereof toward the base terminal of the amplification transistor 20. With this configuration, a constant current outputted from the constant current source 24 is inputted to the base terminal of the constant current amplification transistor 220 and is amplified to be the DC bias current. Then, the DC bias current is supplied to the base terminal of the amplification transistor 20 from the emitter terminal of the constant current amplification transistor 220 while flowing through the resistor element 251.

In other words, the power amplification circuit 1E according to the variation includes a plurality of amplification transistors connected in cascade, which include the amplification transistor 10 as a first amplification transistor. Further, among the plurality of amplification transistors described above, the amplification transistor 10 arranged at at least one anterior stage relative to the last stage closest to the output terminal of the power amplification circuit 1E is the above-described first amplification transistor. At the anterior stage, the variable voltage power supply 11, the bias circuit 12, and the current limiting circuit 13 are arranged.

With the power amplification circuit 1E according to the variation, the current limiting circuit 13 is connected to the amplification transistor 10 of the anterior stage (drive stage), it is possible to effectively improve the PAE (power-added efficiency) in the case of the APT mode.

Other Embodiments and the Like

While the power amplification circuit according to the embodiment of the disclosure has been described with reference to the embodiments and the variations thereof, the power amplification circuit according to the disclosure is not limited to the above-described embodiments and the variations thereof. The disclosure also encompasses other embodiments that are realized by combining desired components in the above embodiments and the variations thereof, variations that are obtained by making, on the above embodiments and the variations thereof, various variations at which those skilled in the art can arrive in a range without departing from the spirit of the disclosure, and various kinds of equipment incorporating the power amplification circuit according to the disclosure.

For example, the power amplification circuit 1 according to the embodiment and the power amplification circuits 1A to 1C according to the variations thereof are applicable not only to the ET method as described above but also to the APT (average power tracking) method in which the average power amplitude of the high-frequency signal, which is calculated every predetermined time period, is tracked.

In addition, in the power amplification circuits according to the above embodiments and the variations thereof, another high-frequency circuit element, a wiring, and the like may be inserted into paths connecting the circuit elements and the signal paths disclosed in the drawings.

The present disclosure is widely applicable to communication equipment as a power amplification circuit that amplifies a high-frequency signal.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplification circuit, comprising:
   a first amplification transistor that has a first terminal, a second terminal, and a first control terminal, that is configured to perform power amplification on a high-frequency signal input from the first control terminal, and that is configured to output the high-frequency signal on which the power amplification has been performed from the first terminal;
   a variable voltage power supply configured to supply a variable voltage to the first terminal;
   a bias circuit configured to output a direct current (DC) bias current; and
   a current limiting circuit configured to limit the DC bias current,
   wherein the bias circuit comprises a constant current amplification transistor that has a third terminal, a fourth terminal, and a second control terminal and that is configured to output the DC bias current from the fourth terminal to the first control terminal, and
   wherein the current limiting circuit comprises:
      a current limiting transistor that has a fifth terminal, a sixth terminal, and a third control terminal, the sixth terminal being connected to the fourth terminal;
      a first resistance element having a first end connected to the fifth terminal and having a second end connected to the variable voltage power supply; and
      a second resistance element having a first end connected to the third control terminal and having a second end connected to the second control terminal.

2. The power amplification circuit according to claim 1, wherein when the variable voltage becomes less than a reference voltage, as a potential difference between the reference voltage and the variable voltage increases, the current limiting circuit is configured to increase a DC limiting current flowing from the second control terminal to the fifth terminal and through the third control terminal.

3. The power amplification circuit according to claim 1, wherein:
   the first resistance element includes a first split resistor and a second split resistor connected in series, and
   the current limiting circuit further comprises:
      a first capacitive element connected in parallel to the first split resistor; and
      a second capacitive element connected between the third control terminal and the fifth terminal.

4. The power amplification circuit according to claim 2, wherein:
   the first resistance element includes a first split resistor and a second split resistor connected in series, and
   the current limiting circuit further comprises:
      a first capacitive element connected in parallel to the first split resistor; and
      a second capacitive element connected between the third control terminal and the fifth terminal.

5. The power amplification circuit according to claim 1, wherein:
   the first resistance element comprises a first split resistor and a second split resistor connected in series, and
   the current limiting circuit further comprises:
      a first capacitive element connected between the sixth terminal and a node between first split resistor and the second split resistor; and
      a second capacitive element connected between the third control terminal and the fifth terminal.

6. The power amplification circuit according to claim 2, wherein:
the first resistance element comprises a first split resistor and a second split resistor connected in series, and
the current limiting circuit further comprises:
a first capacitive element connected between the sixth terminal and a node between first split resistor and the second split resistor; and
a second capacitive element connected between the third control terminal and the fifth terminal.

7. The power amplification circuit according to claim 1, wherein the power amplification circuit comprises a plurality of amplification transistors connected in cascade, the first amplification transistor being one of the plurality of amplification transistors.

8. The power amplification circuit according to claim 2, wherein the power amplification circuit comprises a plurality of amplification transistors connected in cascade, the first amplification transistor being one of the plurality of amplification transistors.

9. The power amplification circuit according to claim 3, wherein the power amplification circuit comprises a plurality of amplification transistors connected in cascade, the first amplification transistor being one of the plurality of amplification transistors.

10. The power amplification circuit according to claim 5, wherein the power amplification circuit comprises a plurality of amplification transistors connected in cascade, the first amplification transistor being one of the plurality of amplification transistors.

11. The power amplification circuit according to claim 7, wherein the first amplification transistor is a final stage transistor closest to an output terminal of the power amplification circuit.

12. The power amplification circuit according to claim 7, wherein the first amplification transistor is a transistor of at least one stage anterior to a final stage transistor closest to an output terminal of the power amplification circuit.

13. The power amplification circuit according to claim 11, wherein the first amplification transistor is a transistor of at least one anterior stage relative to a final stage transistor closest to an output terminal of the power amplification circuit.

14. The power amplification circuit according to claim 1, further comprising a power supply control circuit configured to control the variable voltage in accordance with a high-frequency power amplitude of a high-frequency input signal input to the power amplification circuit.

15. The power amplification circuit according to claim 14, wherein the power supply control circuit is configured to control the variable voltage such that the variable voltage is a linear function of the high-frequency power amplitude.

\* \* \* \* \*